United States Patent
Duch et al.

(10) Patent No.: US 7,751,163 B2
(45) Date of Patent: Jul. 6, 2010

(54) ELECTRIC DEVICE PROTECTION CIRCUIT AND METHOD FOR PROTECTING AN ELECTRIC DEVICE

(75) Inventors: Alexander Duch, Paris (FR); Ulrich Klostermann, Landshut (DE); Michael Kund, Tuntenhausen (DE)

(73) Assignees: Qimonda AG, Munich (DE); ALTIS Semiconductor, SNC, Corbeil Essonnes Cedex (FR)

( * ) Notice: Subject to any disclaimer, the term of this patent is extended or adjusted under 35 U.S.C. 154(b) by 935 days.

(21) Appl. No.: 11/541,402

(22) Filed: Sep. 29, 2006

(65) Prior Publication Data

US 2008/0080109 A1 Apr. 3, 2008

(51) Int. Cl.
*H02H 9/00* (2006.01)
(52) U.S. Cl. ......................................... 361/56
(58) Field of Classification Search ............ 361/56
See application file for complete search history.

(56) References Cited

U.S. PATENT DOCUMENTS

| | | | |
|---|---|---|---|
| 4,924,340 | A | 5/1990 | Sweet |
| 5,568,345 | A | 10/1996 | Mudd et al. |
| 7,212,388 | B2 | 5/2007 | Wizemann et al. |
| 2001/0012189 | A1 | 8/2001 | Tang |
| 2006/0250731 | A1 | 11/2006 | Parkhurst et al. |

FOREIGN PATENT DOCUMENTS

| | | |
|---|---|---|
| DE | 39 15 198 A1 | 11/1990 |
| DE | 102 00 830 A1 | 7/2003 |
| DE | 10 2004 062 205 A1 | 7/2006 |
| EP | 0 198 624 A1 | 10/1986 |
| EP | 0 196 891 B1 | 11/1989 |
| EP | 0 651 490 A1 | 5/1995 |
| EP | 0 651 490 B1 | 5/1995 |
| EP | 1 309 060 A2 | 5/2003 |
| GB | 2 425 885 A | 11/2006 |
| WO | WO 00/64025 A1 | 10/2000 |
| WO | WO 03/038257 A1 | 5/2003 |
| WO | WO 2006/072292 A1 | 7/2006 |

OTHER PUBLICATIONS

BGF104, Data Sheet,V2.1, "HSMMC Interface Filter and ESD Protection," Infineon Technologies AG, Oct. 17, 2006, pp. 1-6.
"ESD1P0RF," Workshop Document, Infineon Technologies AG, Nov. 9, 2006, pp. 1-9.

*Primary Examiner*—Stephen W Jackson
(74) *Attorney, Agent, or Firm*—Slater & Matsil, L.L.P.

(57) ABSTRACT

An electric device protection circuit comprises at least one conductive bridging unit which electrically connects a terminal of the electric device to a protection node set to a protection potential, the protection potential being chosen such that the conductive bridging unit switches from a resistive state to a conductive state in case that the voltage or current at the terminal exceeds a predetermined threshold value.

31 Claims, 4 Drawing Sheets

ESD Models - Pulse Parameters

| Pulse Parameter | HBM | MM | CDM |
|---|---|---|---|
| Reference Voltage | 2 kV | 200 V | 1 kV |
| Peak Current* | 1.3 A | 3.5 A | 36 A |
| Rise time* | 10 ns | 10 ns | 250 ps |
| Pulse duration* | 150 ns | 150 ns | 700 ps |

* HBM,MM: short circuit measurement; CDM: 30 pF test modul

ELECTRIC DEVICE PROTECTION CIRCUIT AND METHOD FOR PROTECTING AN ELECTRIC DEVICE

TECHNICAL FIELD

The invention relates to an electric device protection circuit and method for protecting an electric device.

BACKGROUND

Generally, electrostatic discharge (ESD) is the transfer of an electrostatic charge between bodies at different electrostatic potentials (voltages), caused by direct contact or induced by an electrostatic field. In the electronics field, as internal structures and electronic components in integrated circuits continue to get smaller, it is becoming easier to destroy or otherwise impair integrated circuits through the discharge of static electricity. ESD has become a critical problem for the electronics industry, and it is desirable to develop new types of protection circuits.

SUMMARY OF THE INVENTION

According to one embodiment of the present invention, an electric device protection circuit is provided that comprises at least one conductive bridging unit, which electrically connects a terminal of the electric device to a protection node set to a protection potential, the protection potential being chosen such that the conductive bridging unit switches from a resistive state to a conductive state in the case that the voltage or current at the terminal exceeds a predetermined threshold value.

BRIEF DESCRIPTION OF THE DRAWINGS

For a more complete understanding of exemplary embodiments of the present invention and the advantages thereof, reference is now made to the following description taken in conjunction with the accompanying drawings, in which.

DETAILED DESCRIPTION OF ILLUSTRATIVE EMBODIMENTS

Figure 1:
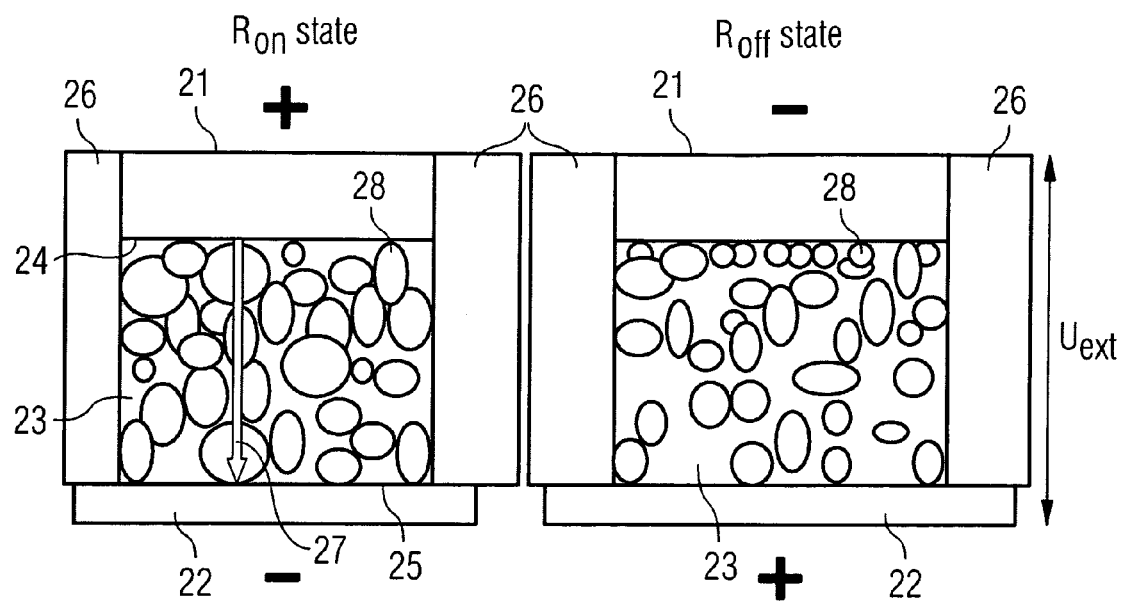
FIG. 1a shows a schematic cross-sectional view of a conductive bridging unit set to a first switching state.
FIG. 1b shows a schematic cross-sectional view of a conductive bridging unit set to a second switching state.

According to one embodiment of the present invention, a protection circuit is provided protecting an electric device against voltage peaks or current peaks occurring at a terminal of the electric device. The protection circuit includes at least one conductive bridging unit that electrically connects the terminal to a protection node set to a protection potential, the protection potential being chosen such that the conductive bridging unit switches from a resistive state to a conductive state in the case that the voltage or the current at the terminal exceeds (or falls below) a predetermined threshold value.

Conductive bridging units are normally used as memory cells of conductive bridging random access memory (CBRAM) devices, also known as solid electrolyte random access memory devices. In the scope of the present invention, however, conductive bridging units are used as components of protection circuits. One advantage of protection circuits being based upon conductive bridging units is that conductive bridging units only need two terminals for both switching the conductive bridging unit from a resistive state to a conductive state or vice versa and to route currents through the conductive bridging units. As a consequence, the protection circuit architecture is very simple. Another advantage of conductive bridging units is that that the switching speed is very high. Conductive bridging units are usually formed of chalcogenide material. However, the invention is not restricted thereto. Any type of material may be used to form a conductive bridging unit in which electrically conductive filaments can be formed, in a reversible as well as in an irreversible manner and in a volatile as well as in a non-volatile manner. The filaments may have a diameter in a range of about 1 nm to 100 nm, e.g., 1 nm to 20 nm.

According to one embodiment of the present invention, the terminal of the electric device may be, for example, an input terminal of any type, such as a voltage/current supply receiving terminal or a terminal receiving a data signal to be processed by the electric device, or an output terminal of any type, such as a voltage/current supplying terminal or a terminal outputting a data signal.

According to one embodiment of the present invention, the protection circuit includes a first conductive bridging unit and a second conductive bridging unit, each conductive bridging unit including a reactive electrode, an inert electrode, and a solid electrolyte (ion conductor) positioned between the reactive electrode and the inert electrode.

According to one embodiment of the present invention, the inert electrode of the first conductive bridging unit is connected to a first protection node set to a first protection potential, and the reactive electrode of the first conductive bridging unit is connected to the terminal, wherein the inert electrode of the second conductive bridging unit is connected to the terminal, and the reactive electrode of the second conductive bridging unit is connected to a second protection node set to a second protection potential.

According to one embodiment of the present invention, the first protection node is a VDD node (e.g., Supply voltage node) of the electric device, and the second protection node is a VSS node (e.g., ground node) of the electric device. In other words, the first protection node may be a node receiving a first reference voltage, and the second protection node may be a node receiving a second reference voltage. In an alternative embodiment of the invention, any other reference potentials which define a voltage interval in which the electric device may be operated may be used.

According to one embodiment of the present invention, the protection circuit includes erasing voltage generating means electrically connected to the conductive bridging units, the erasing voltage generating means generating erasing voltages and supplying the generated erasing voltages to the conductive bridging units, the erasing voltages having an effect of switching the conductive bridging units from the conductive state to the resistive state.

According to one embodiment of the present invention, the erasing voltage generating means applies the erasing voltages to the conductive bridging units during a power up sequence of the electric device.

According to one embodiment of the present invention, each conductive bridging unit is realized such that it automatically switches from a conductive state to a resistive state as soon as the voltage peaks or current peaks occurring at the terminal have vanished.

According to one embodiment of the present invention, the solid electrolyte of each conductive bridging unit is doped with metallic material. For example, each conductive bridging unit may be doped with metal such that no permanent conductive state of the solid electrolyte can be maintained if the voltage levels or current levels occurring at the terminal lie below respective predetermined threshold values.

According to one embodiment of the present invention, the protection circuit includes resistance determining means electrically connected to the conductive bridging units determining the resistance of the conductive bridging units (for example, by routing sensing currents through the conductive bridging units).

According to one embodiment of the present invention, the protection circuit includes voltage and current tracking means tracking voltage peaks and/or current peaks applied to the terminal in the past (for example, by processing sensing currents routed through the conductive bridging units).

According to one embodiment of the present invention, the protection circuit includes writing voltage generating means electrically connected to the conductive bridging units, the writing voltage generating means generating writing voltages and supplying the writing voltages to the conductive bridging units.

According to one embodiment of the present invention, the protection circuit includes a transport protection means making use of the writing voltage generating means, the transport protection means allowing switching the conductive bridging units to a conductive state until the electric device has been assembled.

According to one embodiment of the present invention, the protection circuit is removably attached to the electric device.

According to one embodiment of the present invention, the protection circuit is mounted on a separate circuit board.

According to one embodiment of the present invention, an electric device includes a terminal and a protection circuit protecting the electric device against voltage peaks or current peaks occurring at the terminal, wherein the protection circuit includes at least one conductive bridging unit that electrically connects the terminal to a protection node set to a protection potential, the protection potential being chosen such that the conductive bridging unit switches from a resistive state to a conductive state in the case that the voltage or the current at the terminal exceeds (or falls below) a predetermined threshold value.

According to one embodiment of the present invention, the protection circuit includes a first conductive bridging unit and a second conductive bridging unit, each conductive bridging unit including a reactive electrode, an inert electrode, and a solid electrolyte positioned between the reactive electrode and the inert electrode.

According to one embodiment of the present invention, the inert electrode of the first conductive bridging unit is electrically connected to a first protection node set to a first protection potential, and the reactive electrode of the first conductive bridging unit is connected to the terminal, wherein the inert electrode of the second conductive bridging unit is connected to the terminal, and the reactive electrode of the second conductive bridging unit is connected to a second protection node set to a second protection potential.

According to one embodiment of the present invention, a method of protecting an electric device is provided, including the process of connecting at least one conductive bridging unit to a terminal of the electric device and to a node set to a protection potential such that the at least one conductive bridging unit connects the terminal to a protection node.

According to one embodiment of the present invention, a method for protecting an electric device against voltage peaks or current peaks occurring at a terminal of the electric device is provided, the method including the following processes providing at least one conductive bridging unit, and electrically connecting each conductive bridging unit provided to the terminal and to a protection node set to a protection potential such that each conductive bridging unit electrically connects the terminal to a protection node.

According to one embodiment of the present invention, the method includes switching at least one conductive bridging unit from a resistive state to a conductive state in the case that the voltage or the current at the terminal exceeds (or falls below) a predetermined threshold value.

According to one embodiment of the present invention, the protection circuit includes a first conductive bridging unit and a second conductive bridging unit, each conductive bridging unit including a reactive electrode, an inert electrode, and a solid electrolyte positioned between the reactive electrode and the inert electrode.

According to one embodiment of the present invention, the method includes electrically connecting the inert electrode of the first conductive bridging unit to a first protection node set to a first protection potential, electrically connecting the reactive electrode of the first conductive bridging unit to the terminal, electrically connecting the inert electrode of the second conductive bridging unit to the terminal, and electrically connecting the reactive electrode of the second conductive bridging unit to a second protection node set to a second protection potential.

According to one embodiment of the present invention, the first protection node is a VDD node of the electric device, and the second protection node is a VSS node of the electric device. In other words, the first protection node may be a node receiving a first reference voltage, and the second protection node may be a node receiving a second reference voltage.

According to one embodiment of the present invention, the method includes generating erasing voltages and supplying the erasing voltages to the conductive bridging units, the erasing voltages having an effect of switching the conductive bridging units from the conductive state to the resistive state.

According to one embodiment of the present invention, the erasing voltages are applied during a power up sequence of the electric device.

According to one embodiment of the present invention, the method includes switching all conductive bridging units currently having a conductive state to a resistive state when the voltage peaks or the current peaks occurring at the terminal have been vanished.

According to one embodiment of the present invention, the method includes determining the resistance of the conductive bridging units (for example, by routing sensing currents through the conductive bridging units).

According to one embodiment of the present invention, the method includes tracking voltage peaks or current peaks occurring at the terminal (for example, by processing the sensing currents routed through the conductive bridging units).

According to one embodiment of the present invention, the method includes generating writing voltages and supplying the writing voltages to the conductive bridging units.

According to one embodiment of the present invention, the process of applying writing voltages is carried out at the beginning of an assembling process of the electric device, wherein after having finished the assembling process, erasing voltages are generated and supplied to the conductive bridging units, the erasing voltages having an effect of switching the conductive bridging units from the conductive state to the resistive state.

In the following description, making reference to FIGS. 1a and 1b, a basic principle underlying one embodiment of a conductive bridging unit (which, in the following, is also referred to as CBRAM cell) will be explained.

As shown in FIG. 1a, a CBRAM cell includes a first electrode 21, a second electrode 22, and a solid electrolyte block 23 sandwiched between the first electrode 21 and the second electrode 22. The first electrode 21 contacts a first surface 24 of the solid electrolyte block 23, the second electrode 22 contacts a second surface 25 of the solid electrolyte block 23. The solid electrolyte block 23 is isolated from its environment by an isolation structure 26. The first surface 24 is usually the top surface, and the second surface 25 is the bottom surface of the solid electrolyte block 23. In the same way, the first electrode 21 is generally the top electrode, and the second electrode 22 is the bottom electrode of the CBRAM cell. One of the first electrode 21 and the second electrode 22 is a reactive electrode, the other one an inert electrode. Here, the first electrode 21 is the reactive electrode, and the second electrode 22 is the inert electrode. In this example, the first electrode 21 includes silver (Ag), the solid electrolyte block 23 includes silver-doped chalcogenide material, and the isolation structure 26 includes silicon oxide ($SiO_2$). However, the invention is not restricted to these examples of material.

If a voltage as indicated in FIG. 1a is applied across the solid electrolyte block 23, a redox reaction is initiated which drives $Ag^+$ ions out of the first electrode 21 into the solid electrolyte block 23 where they are reduced to Ag, thereby forming Ag rich clusters within the solid electrolyte block 23. If the voltage applied across the solid electrolyte block 23 is applied for a long period of time, the size and the number of Ag rich clusters within the solid electrolyte block 23 are increased to such an extent that a conductive bridge 27, between the first electrode 21 and the second electrode 22 is formed. In the case that a voltage is applied across the solid electrolyte block 23, as shown in FIG. 1b (inverse voltage compared to the voltage applied in FIG. 1a), a redox reaction is initiated which drives $Ag^+$ ions out of the solid electrolyte block 23 into the first electrode 21 where they are reduced to Ag. As a consequence, the size and the number of Ag rich clusters within the solid electrolyte block 23 are reduced, thereby erasing the conductive bridge 27.

In order to determine the current memory status of a CBRAM cell, a sensing current is routed through the CBRAM cell. The sensing current experiences a high resistance in the case that no conductive bridge 27 exists within the CBRAM cell, and experiences a low resistance in the case that a conductive bridge 27 exists within the CBRAM cell. A high resistance may, for example, represent "0," whereas a low resistance represents "1," or vice versa.

Figure 2:
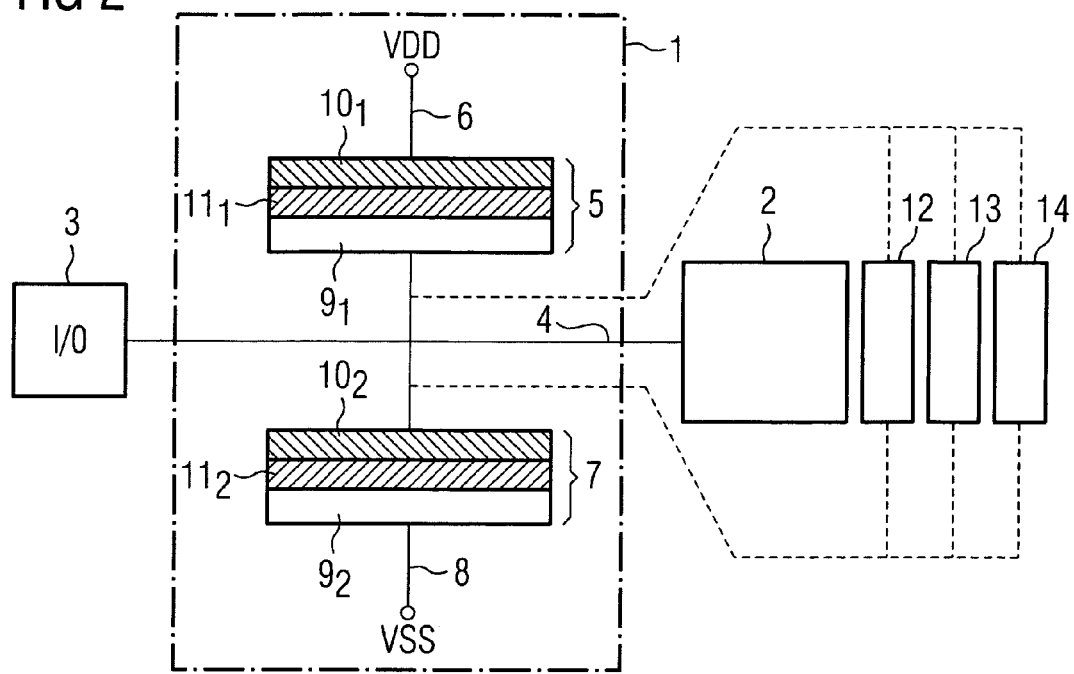
FIG. 2 shows a schematic drawing of one embodiment of the protection circuit according to the present invention.

FIG. 2 shows one embodiment of the protection circuit according to the present invention.

A protection circuit 1 which protects an electric device 2 against voltage peaks and/or current peaks occurring within an electric signal supplied from an energy (voltage/current) supply 3 to a terminal 4 of the electric device 2 includes: a first conductive bridging unit 5 that connects the terminal 4 to a first protection node 6 set to a first protection potential, and a second conductive bridging unit 7 connecting the terminal 4 to a second protection node 8 set to a second protection potential. Electric devices 2 may be, for example, semiconductor devices like micro controller devices or memory devices. In an alternative embodiment of the invention, the electric device may be any kind of device that is voltage sensitive, e.g., an application specific integrated circuit (ASIC), a passive electric device, an electric filter, a sensor, a motor, as well as a composite of such devices. Furthermore, the electric device may be a macroscopic structure like a transformer, a battery, a motor, a heating, etc.

The first conductive bridging unit 5 includes a first reactive electrode $9_1$, a first inert electrode $10_1$, and a first solid electrolyte $11_1$ sandwiched between the first reactive electrode $9_1$ and the first inert electrode $10_1$.

The second conductive bridging unit 7 includes a second reactive electrode $9_2$, a second inert electrode $10_2$, and a second solid electrolyte $11_2$ sandwiched between the second reactive electrode $9_2$ and the second inert electrode $10_2$. The first reactive electrode $9_1$ is connected to the terminal 4, whereas the first inert electrode $10_1$ is connected to the first protection node 6. The second reactive electrode $9_2$ is connected to the second protection node 8, whereas the second inert electrode $10_2$ is connected to the terminal 4.

In this example, the first protection node 6 is a VDD node (e.g., supply voltage node), and the second protection node 8 is a VSS node (e.g., ground node). In an alternative embodiment of the invention, any other reference potentials which define a voltage interval in which the electric device may be operated may be used.

The first conductive bridging unit 5 and second conductive bridging unit 7 work, as explained above, in conjunction with FIGS. 1a and 1b.

Figure 3:
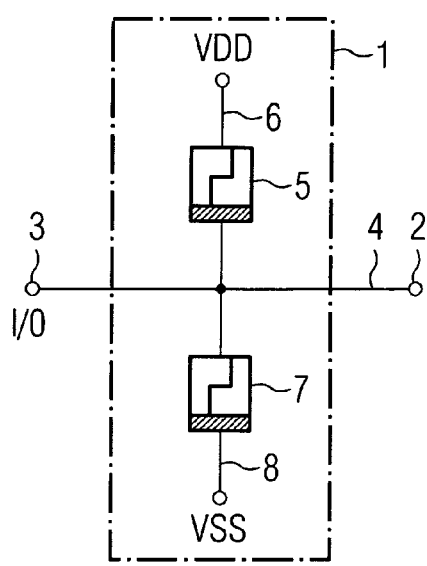
FIG. 3 shows the equivalent circuit of the embodiment shown in FIG. 2.

FIG. 3 shows the equivalent circuit of the circuit arrangement shown in FIG. 2.

The protection circuit 1 protects the electric device 2 both against high positive voltages and high negative voltages. In the case where a high positive voltage is supplied from the voltage/current supply 3 to the terminal 4 of the electric device 2, the first reactive electrode $9_1$ of the first conductive bridging unit 5 will also be set to said high positive voltage.

The high positive voltage at the first reactive electrode $9_1$ has an effect of switching the first conductive bridging unit 5 from a resistive state to a conductive state. As a consequence, the main current flows through the first conductive bridging unit 5, but not through the electric device 2. Thus, the electric device 2 can be prevented from being damaged. In the case where a high negative voltage is supplied from the voltage/current supply 3 to the terminal 4 of the electric device 2, the second inert electrode $10_2$ of the second conductive bridging unit 7 is also set to said high negative voltage. As a consequence, the second conductive bridging unit 7 switches from a resistive state to a conductive state. Thus, the main current flows through the second conductive bridging unit 7, but not through the electric device 2. Thus, the electric device 2 can be prevented from being damaged. Within the scope of the present invention, a "conductive state" of a conductive bridging unit means a memory state in which the sensing current flowing through the conductive bridging unit experiences a low resistance. Corresponding thereto, a "resistive state" of a conductive bridging unit means a memory state in which the sensing current flowing through the conductive bridging unit experiences a high resistance discussed above.

In the embodiment shown in FIG. 2, the voltage difference between the first protection node 6 and the second protection node 8 that are set to constant potential values has the effect that as soon as the voltage supplied by the voltage/current supply 3 drops from voltages larger than the voltage VDD into a voltage range extending from VDD to VSS, the first conductive bridging unit 5 will switch from the conductive state back to the resistive state. Similarly, if the voltage supplied by the voltage/current supply 3 increases from a voltage being lower than the voltage VSS into a voltage range extending from VSS to VDD, the second conductive bridging unit 7 switches from the conductive state back to the resistive state. In other words, the first conductive bridging unit 5 and the second conductive bridging unit 7 switch from the conductive state to the resistive state automatically as soon as the voltage peaks applied to the terminal 4 have vanished. This means that no externally generated erasing voltage has to be applied across the first conductive bridging unit 5 and the second conductive bridging unit 7 in order to switch them from the conductive state back to the resistive state.

FIG. 2 shows the case in which the two conductive bridging units 5, 7 are connected to the terminal 4. The invention, however, is not restricted to this embodiment. For example, only one conductive bridging unit (for example, only the first conductive bridging unit 5), or more than two conductive bridging units may be connected to the terminal 4. Each conductive bridging unit may be connected to an individual protection node having an individual protection potential, respectively. In this way, the conductive bridging units switch from a resistive state to a conductive state at different voltage/current levels. Thus, the history of occurred voltages/currents can be better tracked (each conductive bridging unit represents a particular voltage/current). Further, each conductive bridging unit may have individual physical sizes and/or individual switching properties. If, for example, only the first conductive bridging unit 5 is provided, the first conductive bridging unit 5 will not automatically switch back from the conductive state to the resistive state since the second protection node 8 set to the potential VSS does not exist (which means that no "reverse biasing voltage" responsible for switching from the conductive state to the resistive state does exist). In this case, the solid electrolyte 11 of each conductive bridging unit may be doped with metal such that no permanent conductive state of the solid electrolytes 11 of the conductive bridging units can be maintained at low voltages supplied by the voltage/current supply 3.

A further possibility to switch the conductive bridging units back from the conductive state to the resistive state is to use erasing voltage generating means 12 electrically connected to the first conductive bridging unit 5 and the second conductive bridging unit 7, wherein the erasing voltage generating means 12 generates erasing voltages and supplies the erasing voltages to the conductive bridging units 5, 7, the erasing voltages having an effect of switching the conductive bridging units 5, 7 from the conductive state to the resistive state. Since the erasing voltage generating means 12 is not required in the embodiment shown in FIG. 2, the connections between the erasing voltage generating means 12 and the conductive bridging units 5, 7 are only indicated by dotted lines.

The protection circuit I may also comprise writing voltage generating means 13 electrically connected to the conductive bridging units 5, 7, wherein the writing voltage generating means 13 generates writing voltages and supplies the writing voltages to the conductive bridging units 5, 7, the writing voltages having an effect of switching the conductive bridging units 5, 7 from the resistive state to the conductive state. The writing voltage generating means 13 may be, for example, part of a transport protection means (not shown) making use of the writing voltage generating means 13 in order to switch the conductive bridging unit 5, 7 to a conductive state during a transport process or an assembling process, for example. After the transport process or the assembling process has been finished, the erasing voltage generating means 12 may be used by the transport protection means to switch the conductive bridging units 5, 7 again to the resistive state.

The protection circuit 1 may further comprise a resistance determining means 14 determining the resistance of the conductive bridging units 5, 7 by routing sensing currents through the conductive bridging units 5, 7. The resistance determining means 14 may be, for example, used by voltage/current tracking means (not shown) tracking voltage/current peaks that occurr at the terminal 4 by processing the sensing currents routed through the conductive bridging units 5, 7 (the voltage/current peaks occurring at the terminal have an effect of switching the conductive bridging units 5, 7 from a resistive state to a conductive state, therefore, a conductive bridging unit in a conductive state indicates that voltage/current peaks have occurred). In this way, the "history" of the voltages/currents occurred at the terminal 4 can be tracked.

The protection circuit 1 may be, for example, part of the electric device 2 or a separate unit removably attached from the electric device 2. For example, the protection unit 1 may be mounted on a separate protection circuit board removably attached to the electric device 2.

Figures 4, 5:
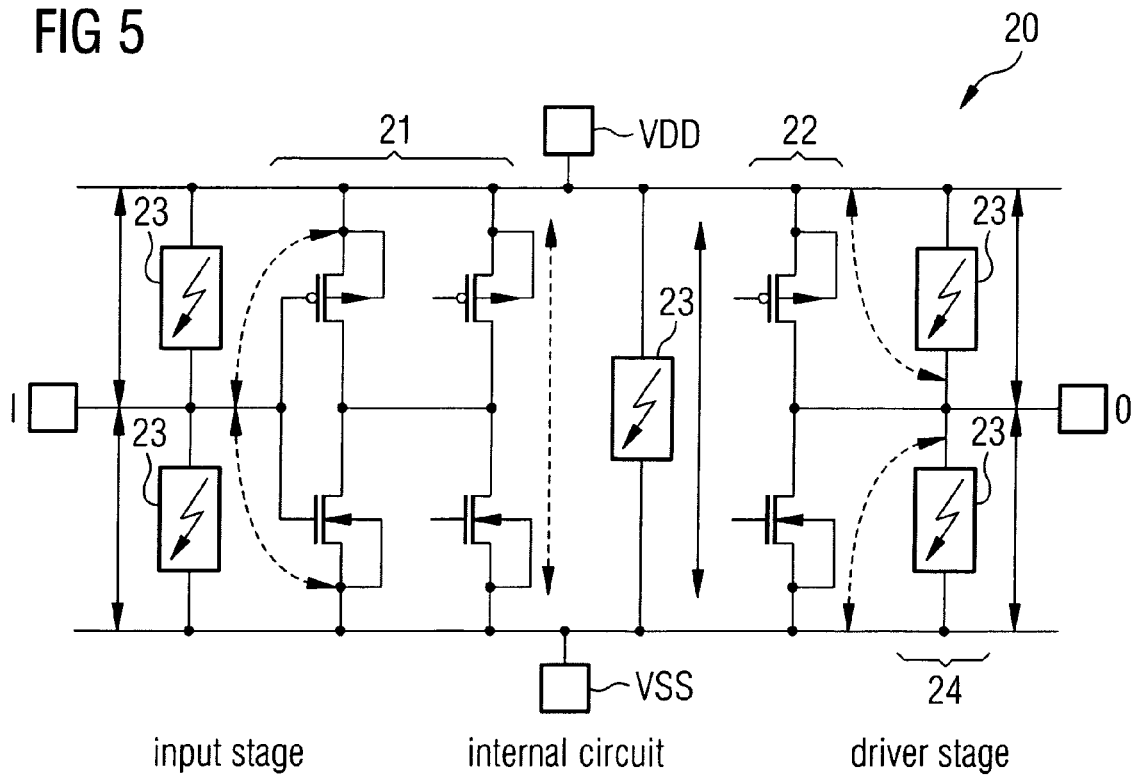
FIG. 4 shows an example of a specification of an ESD (electrostatically discharge) hardness for a semiconductor device.
FIG. 5 shows an example of a protection circuit.

FIG. 4 shows a specification of ESD hardness for an exemplary semiconductor device.

FIG. 5 shows an example of a protection circuit 20, including a first circuit area 21 and a second circuit area 22 protected by diodes 23. In the case of high voltages or currents being applied to the protection circuit 20, an electrical discharge is performed through the diodes 23, thereby protecting the first circuit area 21 and the second circuit area 22.

Figure 6:
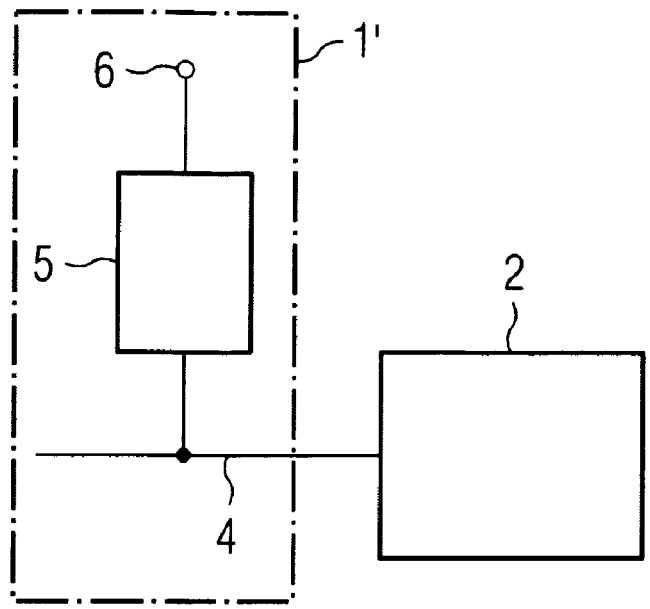
FIG. 6 shows a schematic drawing of one embodiment of the protection circuit according to the present invention.

FIG. 6 shows a schematic drawing of one embodiment of the protection circuit according to the present invention.

An electric device protection circuit 1' that protects an electric device 2 against voltages and/or currents (e.g., voltage peaks or current peaks) includes: a conductive bridging unit 5 which connects a terminal 4 of the electric device 2 to a protection node 6 set to a protection potential. The conductive bridging unit 5 switches (dependent from the value of the protection potential) from a resistive state to a conductive state in the case that the voltages and/or currents at the terminal 4 exceed (or falls under) a predetermined threshold value. In this way, for example, a high current can be guided from the terminal 4 to the protection node 6, and is therefore prevented from being guided from the terminal 4 into the electric device 2. The same applies to voltages. The terminal 4 may be an input terminal or an output terminal.

Figure 7:
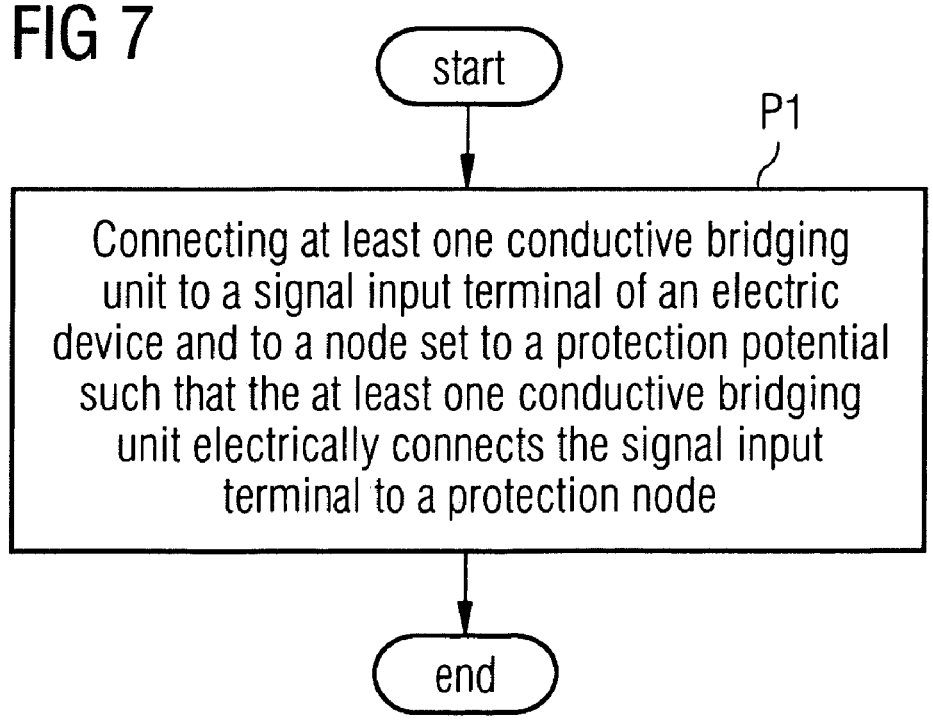
FIG. 7 shows a flow chart of one embodiment of the protection method according to the present invention.

FIG. 7 shows a flow chart of one embodiment of the protection method according to the present invention.

The embodiment of the protection method shown in FIG. 7 comprises a process P1 of connecting at least one conductive bridging unit to a terminal of the electric device and to a node set to a protection potential such that the at least one conductive bridging unit connects the terminal to a protection node.

In the following description, further aspects of the present invention will be explained.

Uncontrolled high voltages and currents can cause severe damages. Therefore, in electric devices (for example, semiconductor devices), generally so called ESD (electrostatically discharge) structures are implemented (within the electric devices or mounted as a barrier before the I/O pins). For example, semiconductor devices are specified to withstand against damages through ESD with the following specifications:

2 kV HBM hardness according to ELA/JESD22-A114-B (MIL-Sted. 883D, method 3015.7
500V CDM hardness according to EOS/ESD association Standard DS5.3-1993

Uncontrolled high voltages or currents can, for example, appear due to electrostatic discharging or voltage variations, e.g., in the electrical power supply.

I/Os of semiconductor devices may be protected by an ESD structure consisting of diodes connecting the I/O with the VSS and the VDD in a backward direction (see FIG. 5). If a high voltage is applied, the current is deviated through the diode (negative to VSS and positive to VDD), thus protecting the devices behind the I/O structure from damages caused by high currents.

A disadvantage of this arrangement is that a lot of space (e.g., the chip area on the substrate level, i.e., the level, at which typical electrical components like diodes or transistors are formed) is required (no shrink potential), and a high process complexity is needed. With shrinking feature sizes, voltages, and currents, the ability of the diodes to carry the not shrinking ESD voltages did not shrink. Devices get, due to reduced gate oxide thicknesses and reduced line width, more and more sensitive to ESD. In order to maintain the protection of the devices, the conventional ESD structure has only limited shrink potential. Together with increasing I/O count, a significant part of the chip area is used for ESD protection structures.

In order to avoid ESD, an environment may be chosen which shows no risk of ESD (e.g., before and in the packaging process of a semiconductor). A disadvantage of this approach is that not all processes are easily controllable (especially at the customer), and that sometimes a high effort is necessary.

According to one embodiment of the present invention, Structures Containing Ion Conducting Materials (SCICM) (e.g., chalcogenide materials doped with silver (Ag)) are used as protection units to prevent structures that are connected in chain after the SCIM from damages by incoming uncontrolled voltages or currents. These structures can, for example, be implemented into IC's by implementation in the production process or as an additional process in the structure or as a separate device connected in chain with the device to be protected.

Advantages of such an arrangement include:
Place reduction;
Low process complexity in implementation;
Repeated utilization possible;
Low effort transport protection possible;
ESD history can be read out;
Size and form can be easily tailored to the intended use; and
No front end of line necessary (can be implemented in all layers as convenient or even fabricated separately and can be attached for example in a multi-chip module or on a common module or board).

According to one embodiment of the present invention, Structures Containing Ion Conducting Materials (SCICM) (e.g., chalcogenide materials doped with silver (Ag), (CBRAM structures)) are used as protection units to prevent structures that are connected in chain after the SCICM from damages by incoming uncontrolled voltages or currents.

The structures provided by the embodiments of the present invention can carry high amounts of current (depending on size, thickness, material, etc.) and are switched on very fast by high voltages. Further, the structures can be switched off after an incident by very low voltages (e.g., 0,05V-0,1 V for $GeS_2$).

According to an embodiment of the present invention, a CBRAM structure having a sub-critical Ag composition that is not sufficient for reaching retention is provided. Thus, a highly conductive path is opened when reaching high voltages, but the CBRAM structure is getting highly resistive when the applied voltage vanishes.

According to one embodiment of the present invention, place consuming backward switched diodes of conventional ESD protection structures are replaced by an Ag doped chalcogenide layer preferably in back end of line connecting the bottom electrode with VSS respectively with VDD and the top electrode (e.g., with the I/O) and thus offering a conductive path for uncontrolled occurring high voltages and currents into a uncritical reservoir (VSS or VDD).

Making the SCICM highly resistive again can, for example, be achieved as follows:

i) The arrangement automatically switches back without extra effort if the arrangement shown in FIG. 2 is used. The I/O voltage in between VDD and VSS biases the protection structure in backward direction and thus set it again in a highly resistive state.

ii) An appropriate circuit, mechanism, or procedure algorithm is used for making the device highly resistive again by applying a high backward current through the device, for example in power up sequence of the device.

iii) A chalcogenide layer doped only by a subcritical amount of silver (Ag) that allows switching with no retention ($R_{on}$ drops even at positive voltages) is provided.

According to one embodiment of the present invention, a "transport" protection is implemented which is, per default, in a low resistive state until the device is finally assembled.

According to one embodiment of the present invention, a separated protection device is fabricated which can be assembled with the electric device to be protected by using a Multi Chip Package, or by soldering, wedging, bonding, gluing, etc.

According to one embodiment of the present invention, the amplitude of an outgoing signal, current, or voltage is limited by connecting the output terminal supplying the outgoing signal, current or voltage to the protection circuit according to the present invention (i.e., by enclosing the outgoing signal, current or voltage in the intended voltage guard band).

According to one embodiment of the present invention, voltage or current incidents are tracked by not erasing the states of SCICM, thereby knowing the history of the device.

As used herein, the terms "connected" and "coupled" are intended to include both direct and indirect connection and coupling, respectively.

In the context of this description chalcogenide material usable as ion conductor material (also referred to as solid electrolyte material) is to be understood, for example, as any compound containing sulphur, selenium, germanium and/or tellurium. In accordance with one embodiment of the invention, the ion conducting material is, for example, a compound, which is made of a chalcogenide and at least one metal of the group I or group II of the periodic system, for example, arsene-trisulfide-silver. Alternatively, the chalcogenide material contains germanium-sulfide (GeS), germanium-selenide (GeSe), tungsten oxide ($WO_x$), copper sulfide (CuS) or the like. The ion conducting material may be a solid state electrolyte.

Furthermore, the ion conducting material can be made of a chalcogenide material containing metal ions, wherein the metal ions can be made of a metal, which is selected from a group consisting of silver, copper zinc, or of a combination or an alloy of these metals.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined solely by the claims appended hereto.

What is claimed is:

1. An electric device protection circuit for an electric device, the electric device protection circuit comprising:
    at least one conductive bridging unit electrically connecting a terminal of the electric device to a protection node set to a protection potential, the protection potential selected such that the at least one conductive bridging unit switches from a resistive state to a conductive state when a voltage or current at the terminal exceeds a predetermined threshold value; and
    a first conductive bridging unit and a second conductive bridging unit, each conductive bridging unit including a reactive electrode, an inert electrode, and a solid electrolyte arranged between the reactive electrode and the inert electrode.

2. The electric device protection circuit according to claim 1, wherein the inert electrode of the first conductive bridging unit is connected to a first protection node set to a first protection potential, and the reactive electrode of the first conductive bridging unit is connected to the terminal, the inert electrode of the second conductive bridging unit is connected to the terminal, and the reactive electrode of the second conductive bridging unit is connected to a second protection node set to a second protection potential.

3. The electric device protection circuit according to claim 2, wherein the first protection node receives a first reference voltage, and the second protection node receives a second reference voltage.

4. An electric device protection circuit for an electric device, the electric device protection circuit comprising:
    at least one conductive bridging unit electrically connecting a terminal of the electric device to a protection node set to a protection potential, the protection potential selected such that the at least one conductive bridging unit switches from a resistive state to a conductive state when a voltage or current at the terminal exceeds a predetermined threshold value; and
    erasing voltage generating means electrically connected to the at least one of the at least one conductive bridging unit, the erasing voltage generating means generating erasing voltages and supplying the erasing voltages to connected conductive bridging units, the erasing voltages having an effect of switching the connected conductive bridging units from the conductive state to the resistive state.

5. The electric device protection circuit according to claim 4, wherein the erasing voltage generating means supplies the erasing voltages to the connected conductive bridging units during a power up sequence of the electric device.

6. The electric device protection circuit according to claim 1, wherein the at least one conductive bridging unit is configured such that it automatically switches from a conductive state to a resistive state when the voltage peaks or current peaks at the terminal have vanished.

7. The electric device protection circuit according to claim 6, wherein a solid electrolyte of the at least one conductive bridging unit is doped with metal.

8. The electric device protection circuit according to claim 7, wherein the solid electrolyte of the at least one conductive bridging unit is doped with metal such that no permanent conductive state of the solid electrolyte can be maintained at voltage levels or current levels lying below the predetermined threshold value.

9. An electric device protection circuit for an electric device, the electric device protection circuit comprising:
    at least one conductive bridging unit electrically connecting a terminal of the electric device to a protection node set to a protection potential, the protection potential selected such that the at least one conductive bridging unit switches from a resistive state to a conductive state when a voltage or current at the terminal exceeds a predetermined threshold value; and
    resistance determining means electrically connected to the at least one conductive bridging unit, the resistance determining means determining the resistance of the at least one conductive bridging unit.

10. The electric device protection circuit according to claim 9, wherein the determining means determine the resistance of the at least one conductive bridging unit by routing sensing currents through the at least one conductive bridging unit.

11. An electric device protection circuit for an electric device, the electric device protection circuit comprising:
    at least one conductive bridging unit electrically connecting a terminal of the electric device to a protection node set to a protection potential, the protection potential selected such that the at least one conductive bridging unit switches from a resistive state to a conductive state when a voltage or current at the terminal exceeds a predetermined threshold value; and
    voltage/current tracking means electrically connected to the at least one conductive bridging unit, the voltage/current tracking means tracking voltage peaks or current peaks occurring at the terminal.

12. The electric device protection circuit according to claim 11, wherein the track means tracking voltage peaks or current peaks occurring at the terminal by processing sensing currents routed through the at least one conductive bridging unit.

13. An electric device protection circuit for an electric device, the electric device protection circuit comprising:
    at least one conductive bridging unit electrically connecting a terminal of the electric device to a protection node set to a protection potential, the protection potential selected such that the at least one conductive bridging unit switches from a resistive state to a conductive state when a voltage or current at the terminal exceeds a predetermined threshold value; and
    writing voltage generating means electrically connected to at least one of the at least one conductive bridging unit, the writing voltage generating means generating writing voltages and supplying the writing voltages to the connected conductive bridging units.

14. The electric device protection circuit according to claim 13, further comprising a transport protection means making use of the writing voltage generating means in order to switch the at least one conductive bridging unit to a conductive state until the electric device has been assembled.

15. An electric device protection circuit for an electric device, the electric device protection circuit comprising:

at least one conductive bridging unit electrically connecting a terminal of the electric device to a protection node set to a protection potential, the protection potential selected such that the at least one conductive bridging unit switches from a resistive state to a conductive state when a voltage or current at the terminal exceeds a predetermined threshold value, wherein the protection circuit is removably attached to the electric device.

16. An electric device protection circuit for an electric device, the electric device protection circuit comprising:
at least one conductive bridging unit electrically connecting a terminal of the electric device to a protection node set to a protection potential, the protection potential selected such that the at least one conductive bridging unit switches from a resistive state to a conductive state when a voltage or current at the terminal exceeds a predetermined threshold value,
wherein the protection circuit is mounted on a separate circuit board.

17. An electric device comprising:
a terminal; and
a protection circuit protecting the electric device against voltage peaks or current peaks occurring at the terminal, the protection circuit comprising at least one conductive bridging unit which connects the terminal to a protection node set to a protection potential, the protection potential being chosen such that the at least one conductive bridging unit switches from a resistive state to a conductive state when a voltage or a current at the terminal exceeds a predetermined threshold value, wherein the at least one conductive bridging unit further comprises a first conductive bridging unit and a second conductive bridging unit, each conductive bridging unit including a reactive electrode, an inert electrode, and a solid electrolyte arranged between the reactive electrode and the inert electrode.

18. The electric device according to claim 17, wherein the inert electrode of the first conductive bridging unit is connected to a first protection node set to a first protection potential, and the reactive electrode of the first conductive bridging unit is connected to the terminal, the inert electrode of the second conductive bridging unit is connected to the terminal, and the reactive electrode of the second conductive bridging unit is connected to a second protection node set to a second protection potential.

19. A method of protecting an electric device, the method comprising connecting at least one conductive bridging unit to a terminal of the electric device and to a node set to a protection potential such that the at least one conductive bridging unit connects the terminal to a protection node, and choosing the protection potentials of the protection nodes such that the at least one connected conductive bridging unit switches from a resistive state to a conductive state when a voltage or current at the terminal exceeds a predetermined threshold value.

20. The method according to claim 19, wherein the at least one conductive bridging unit further comprises a first conductive bridging unit and a second conductive bridging unit, each conductive bridging unit comprising a reactive electrode, an inert electrode, and an solid electrolyte arranged between the reactive electrode and the inert electrode.

21. The method according to claim 20, further comprising:
connecting the inert electrode of the first conductive bridging unit to a first protection node set to a first protection potential;
connecting the reactive electrode of the first conductive bridging unit to the terminal;
connecting the inert electrode of the second conductive bridging unit to the terminal; and
connecting the reactive electrode of the second conductive bridging unit to a to a second protection node set to a second protection potential.

22. The method according to claim 21, wherein the first protection node is a node receiving a first reference potential, and the second protection node is a node receiving a second reference potential.

23. The method according to claim 19, further comprising generating an erasing voltage and supplying the erasing voltage to the at least one conductive bridging unit, the erasing voltages having an effect of switching the at least one conductive bridging unit from the conductive state to the resistive state.

24. The method according to claim 23, wherein the erasing voltages are applied during a power up sequence of the electric device.

25. The method according to claim 19, further comprising switching all conductive bridging units having a conductive state to a resistive state when the voltage peaks or current peaks occurring at the terminal have been vanished.

26. The method according to claim 19, further comprising determining the resistance of the at least one conductive bridging unit.

27. The method according to claim 26, further comprising determining the resistance of the at least one conductive bridging unit by routing a sensing current through the conductive bridging unit.

28. The method according to claim 19, further comprising tracking voltage peaks or current peaks occurring at the terminal.

29. The method according to claim 28, further comprising tracking voltage peaks or current peaks occurring at the terminal by processing the sensing currents routed through the at least one conductive bridging unit.

30. The method according to claim 19, further comprising generating writing voltages and supplying the writing voltages to the at least one conductive bridging unit.

31. The method according to claim 30, wherein the applying of writing voltages are carried out at the beginning of an assembling process of the electric device, wherein after having finished the assembling process, erasing voltages are generated and supplied to the at least one conductive bridging unit, the erasing voltages having an effect of switching the at least one conductive bridging unit from the conductive state to the resistive state.

* * * * *